United States Patent [19]

Hirota et al.

[11] Patent Number: 5,027,251

[45] Date of Patent: Jun. 25, 1991

[54] MOSFET INCLUDING CURRENT MIRROR FET THEREIN

[75] Inventors: Masaki Hirota; Norio Fujiki, both of Yokohama; Teruyoshi Mihara, Yokosuka, all of Japan

[73] Assignee: Nissan Motor Co., Ltd., Yokohami, Japan

[21] Appl. No.: 394,098

[22] Filed: Aug. 15, 1989

[30] Foreign Application Priority Data

Aug. 15, 1988 [JP] Japan ............................ 63-107577[U]

[51] Int. Cl.$^5$ .............................................. H02H 9/02
[52] U.S. Cl. ...................................... 361/18; 361/111; 323/315; 357/23.13
[58] Field of Search .................... 361/58, 18, 111, 91; 323/315, 312; 357/23.13

[56] References Cited
FOREIGN PATENT DOCUMENTS 53-10049  1/1978  Japan .................................. 323/315

Primary Examiner—Todd E. DeBoer
Attorney, Agent, or Firm—Foley & Lardner

[57] ABSTRACT

A MOSFET device including a power MOSFET and a current mirror MOSFET, in which the drains of the two MOSFETs are coupled in common to each other, and the gate electrodes of the two MOSFETs are linked in common to each other, and in which a diode device for protecting a gate oxide film for the current mirror MOSFET is connected between the sources of the two MOSFETs.

5 Claims, 3 Drawing Sheets

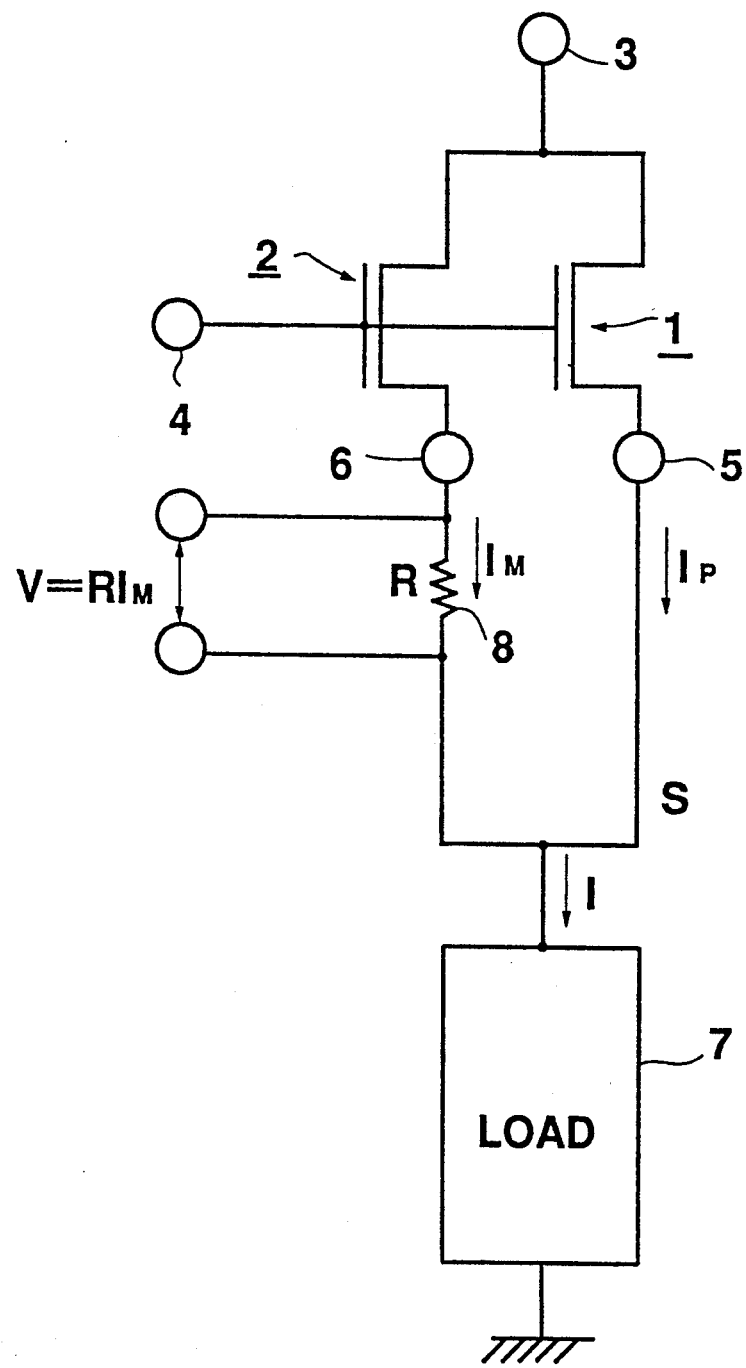

MOSFET INCLUDING CURRENT MIRROR FET THEREIN

BACKGROUND OF THE INVENTION

1. Field of the Invention

The present invention relates to a MOSFET (Metal Oxide Semiconductor Field Effect Transistor) including a current mirror FET for a current detection therein, and more particularly to the protection of a gate insulating film of a current mirror FET in a MOSFET.

2. Description of the Background Art

In FIG. 1, there is shown a conventional MOSFET including a current mirror FET for a current detection therein.

In the drawing, there are two MOSFETs, a power MOSFET 1 and a current mirror MOSFET 2. Their drains $D_P$ and $D_M$ are connected in common to a drain terminal 3, and their gate electrodes $G_P$ and $G_M$ are coupled in common to a gate terminal 4. Their sources $S_P$ and $S_M$ are connected to different source terminals 5 and 6, respectively. In this case, a drain current $I_D$ is obtained by the following formula:

$$I_D = \frac{W}{L} \mu n C_{ox} \{(V_G - V_T)V_D - \tfrac{1}{2}V_D^2\} \quad (1)$$

wherein W: channel width; L: channel length; un: surface mobility of electron; $C_{OX}$: capacitance by oxide film; $V_G$: voltage applied to gate electrode; $V_T$: threshold voltage; and $V_D$: drain voltage.

As apparent from formula (1), by varying the channel width, the drain current $I_D$ is changed. When the channel width of the current mirror MOSFET 2 is determined to one several thousandth to one several tens of thousandth as compared with that of the power MOSFET 1, the current $I_M$ flowing in the current mirror MOSFET 2 becomes one several thousandth to one several tens of thousandth of the current $I_P$ flowing in the power MOSFET 1.

In FIG. 2, there is shown a conventional circuit for detecting a current flowing in the power MOSFET 1 by using the current mirror MOSFET 2. In this method, the detection can be carried out in accordance with the same principle as that of a shunt of a tester or the like.

In FIG. 2, the source terminal 5 of the power MOSFET 1 is directly connected to one terminal of a load 7, and the source terminal 6 of the current mirror MOSFET 2 is also linked to the one terminal of the load 7 via a resistor 8 having a small resistance R interposed in series therebetween. The other terminal of the load 7 is connected to the ground. Now, the voltage between both the ends of the resistor 8 can be obtained in the following formula:

$$V = R \cdot I_M \quad (2)$$

The total current I flowing in the load 7 results in the following formula:

$$I = I_M + I_P \quad (3)$$

The current $I_P$ flowing in the power MOSFET 1 is obtained in the following formula:

$$I_P = \frac{W_P}{W_M} I_M \quad (4)$$

wherein $W_P$ and $W_M$ are the channel widths of the power MOSFET 1 and the current mirror MOSFET 2, respectively. Accordingly, the total current I is obtained in the following formula:

$$I = \frac{W_M + W_P}{W_M} I_M \approx \frac{W_P}{W_M} I_M = \frac{W_P \cdot V}{W_M \cdot R} \quad (5)$$

Therefore, the total current I of the load 7 can be obtained from the voltage V between the ends of the resistor 8.

In the above described conventional MOSFET including the current mirror FET therein, when $W_P \gg W_M$ and the gate electrode of the current mirror MOSFET 2 is small, its gate capacity is very small such as several pF, and its source $S_M$ is directly linked to the source terminal 6. Hence, when an operator touches the source terminal 6 by his hand, static electricity charged on the hand or the like is directly given to the gate oxide film via the source terminal 6, and thus a very high voltage $V = Q/C$ is applied to the gate oxide film to cause a dielectric breakdown therein. In turn, the gate capacity of the power MOSFET 1 is large, and it is far durable to the breakdown due to the static electricity as compared with the current mirror MOSFET 2.

SUMMARY OF THE INVENTION

Accordingly, it is an object of the present invention to provide a MOSFET including a current mirror FET therein, free from the aforementioned disadvantages and defects of the prior art, which is capable of preventing the dielectric breakdown of the gate oxide film of the current mirror FET even when an electrostatic surge is applied to the source terminal of the current mirror MOSFET.

In accordance with one aspect of the present invention, there is provided a MOSFET device, comprising a power MOSFET having a source, a drain and a gate electrode, a current mirror MOSFET having a source, a drain and a gate electrode, and diode means for protecting a gate oxide film for the current mirror MOSFET, the drains of the two MOSFETs being linked in common to each other, the gate electrodes of the two MOSFETs being linked in common to each other, the diode means being connected between the sources of the two MOSFETs.

BRIEF DESCRIPTION OF THE DRAWINGS

FIG. 2 is a circuit diagram of a conventional current detector using the MOSFET shown in FIG. 1;

DESCRIPTION OF THE PREFERRED EMBODIMENT

Figure 1:
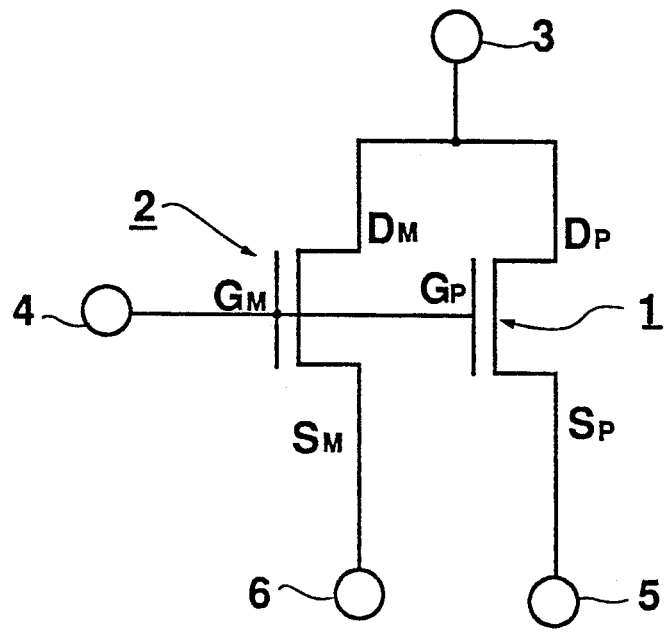
FIG. 1 is a circuit diagram of a conventional MOSFET including a current mirror FET therein.

Referring now to the drawings, wherein like reference characters designate like or corresponding parts throughout the several views, there is shown in FIG. 1 one embodiment of a MOSFET including a current mirror FET therein according to the present invention.

In the drawing, there are shown a power MOSFET 1 having a source $S_P$, a drain $D_P$ and a gate electrode $G_P$ and a current mirror MOSFET 2 having a source $S_M$, a drain $D_M$ and a gate electrode $G_M$, and the channel width of the current mirror MOSFET 2 is approximately one several thousandth to one several tens of thousandth of that of the power MOSFET 1. The drains $D_P$ and $D_M$ of the two MOSFETs 1 and 2 are linked in common to a drain terminal 3, and the gate electrodes $G_P$ and $G_M$ of the two MOSFETs 1 and 2 are coupled in common to a gate terminal 4. The sources $S_P$ and $S_M$ of the two MOSFETs 1 and 2 are connected to separated terminals 5 and 6, respectively.

A first diode device 9 composed of a plurality of diodes connected in series and a second diode device 10 composed of a single diode are coupled in parallel with each other between the sources $S_P$ and $S_M$ of the two MOSFETs 1 and 2. The first and second diode devices 9 and 10 are so connected that the current may flow from the source $S_M$ of the current mirror MOSFET 2 to the source $S_P$ of the power MOSFET 1 through the first diode device 9 and also flow from the source $S_P$ of the latter to the source $S_M$ of the former through the second diode device 10. That is, the anode of one end diode of the first device 9 is coupled to the source $S_M$ of the current mirror MOSFET 2, and the cathode of the other end diode of the same is linked to the source $S_P$ of the power MOSFET 1. Also, the cathode of the single diode of the second diode device 10 is connected to the source $S_M$ of the current mirror MOSFET 2, and the anode of the same is linked to the source $S_P$ of the power MOSFET 1. The first and second diode devices 9 and 10 function in order to protect the gate oxide film of the current mirror MOSFET 2. In this embodiment, the numbers of the diode or diodes of the first and second diode devices 9 and 10 are not restricted to this embodiment, and may be varied, as occasion demands.

The operation of the above descibed MOSFET according to the present invention will now be described in detail.

When a positive electrostatic surge is applied to the source terminal 6 of the current mirror MOSFET 2 by touching a hand or the like of an operator, the first diode device 9 becomes electrically continuous, i.e., allows to pass the current therethrough, and thus the source terminals 6 and 5 of the current mirror MOSFET 2 and the power MOSFET 1 become electrically continuous. Hence, this situation is equivalent to that where the gate electrodes $G_P$ and $G_M$ of the two MOSFETs 1 and 2 are coupled in parallel with each other, and the effective capacity between the source termibnal 6 and gate terminal 4 of the current mirror MOSFET 2 is increased. That is, the gate capacity of the power MOSFET 1 becomes several thousands times to several tens of thousands times of that of the current mirror MOSFET 2, the gate capacity between the source and gate terminals 6 and 4 of the current mirror MOSFET 2 is more than several thousands times of that of the current mirror MOSFET only. As a result, when the positive electrostatic surge is applied to the source terminal 6 of the current mirror MOSFET 2, the voltage to be applied to the gate oxide film of the current mirror MOSFET 2 is extremely reduced, thereby preventing the dielectric breakdown thereof.

The above described MOSFET according to the present invention is usually used in the structure shown in FIG. 2, and hence the voltage of the source terminal 6 of the current mirror MOSFET 2 is higher than that of the source terminal 5 of the power MOSFET 1. Accordingly, usually, it is necessary to provide the first diode device 9 in multi-stages in order to withstand a positive electrostatic surge voltage to be applied to the source terminal 6 of the current mirror MOSFET 2.

Further, when a negative electrostatic surge is applied to the source terminal 6 of the current mirror MOSFET 2, the second diode device 10 becomes electrically continuous, and thus the source terminals 5 and 6 of the power MOSFET 1 and the current mirror MOSFET 2 become electrically continuous. This is equivalent to that the gate capacities of the two MOSFETs 1 and 2 are coupled in parallel to each other in the same manner as described above, and hence the effective capacity between the source and gate electode of the current mirror MOSFET 2 is increased to more than approximately several thousands times. As a result, when the negative electrostatic surge is applied to the source terminal 6 of the current mirror MOSFET 2, the voltage to be applied to the gate oxide film of the current mirror MOSFET 2 is extremely reduced, thereby preventing the dielectric breakdown thereof.

Figure 4:
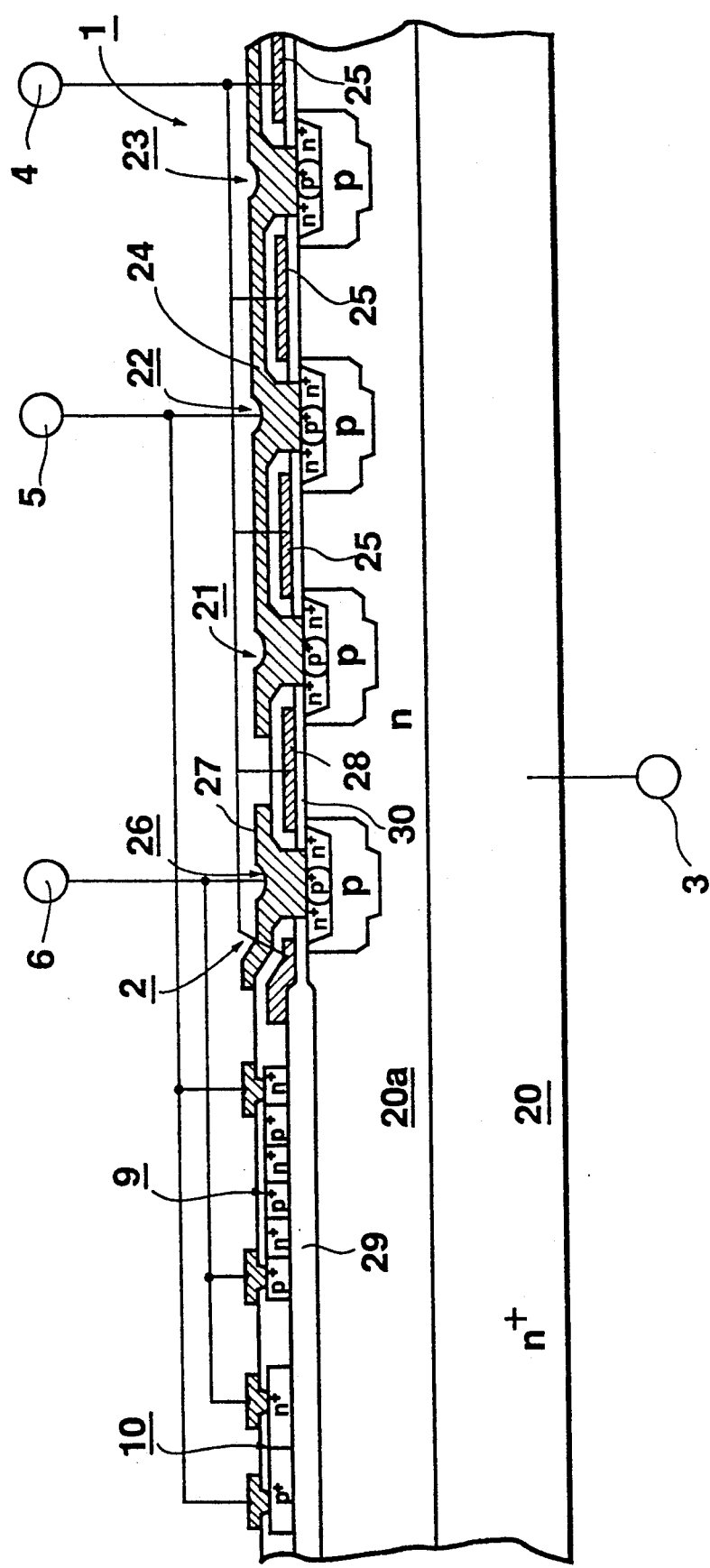
FIG. 4 is a longitudinal cross section of a device including the MOSFET shown in FIG. 3.

In FIG. 4, there is shown a vertical MOSFET device structure including a MOSFET according to the present invention.

Figure 3:
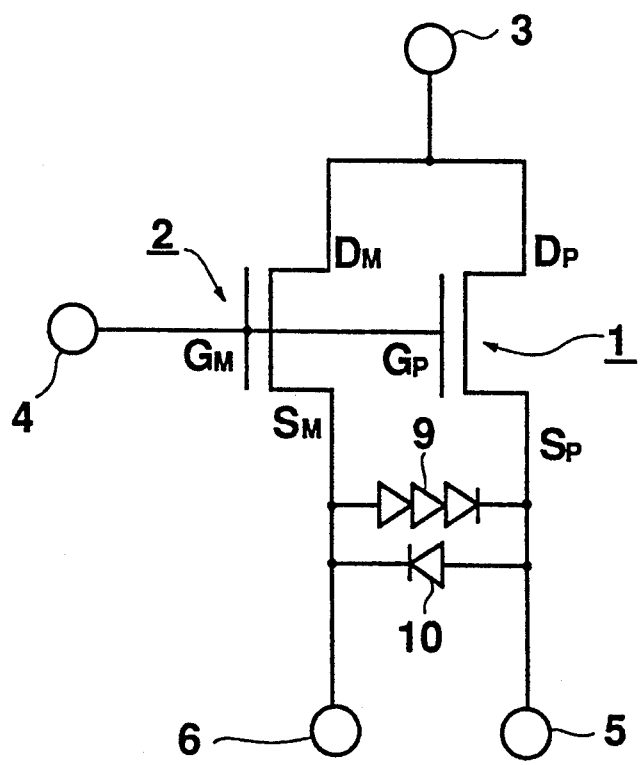
FIG. 3 is a circuit diagram of a MOSFET including a current mirror FET therein according to the present invention.

In FIG. 4, three MOSFETs 21, 22 and 23 having a common source electrode 24 and respective gate electrodes 25 are formed in the upper right hand side portion of an n-type upper region 20a of an $n^+$-type substrate 20 to constitute the power MOSFET 1 shown in FIG. 3, the gate electrodes 25 leading to the gate terminal 4. Another MOSFET 26 having an isolated source electrode 27 and a gate electrode 28 is formed in the upper intermediate portion of the n-type upper region 20a to constitute the current mirror MOSFET 2 shown in FIG. 3. The $n^+$-type substrate 20 is connected to the drain terminal 3. On a left hand side of a LOCOS oxide film 29 formed on the n-type upper region 20a, polycrystaline silicon diodes constituting the first and second diode devices 9 and 10 for protecting a gate oxide film 30 of the current mirror MOSFET 2 are formed, and both the ends of the first and second diode devices 9 and 10 are connected to the source terminals 5 and 6 of the power MOSFET 1 and the current mirror MOSFET 2, as shown in FIGS. 3 and 4. In this case, the current flows from the drain terminal 3 to the source terminals 5 and 6 through the $n^+$-type substrate 20, the n-type upper region 20a and the respective source electrodes 24 and 27.

Although n-channel power MOSFETs are used in a MOSFET according to the present invention, as described above, however, of course, p-channel power MOSFETs may be used by reversing the polarities of the members, with the same effects and advantages as those obtained in the above described embodiment.

What is claimed is:

1. A MOSFET device, comprising:
   a power MOSFET having a source, a drain and a gate electrode;
   a current mirror MOSFET having a source, a drain and a gate electrode, the drains of the two MOSFETs being linked in common to each other, the gate electrodes of the two MOSFETs being linked in common to each other; and
   diode means connected between the sources of the two MOSFETs, for protecting a gate oxide film for the current mirror MOSFET, the diode means including a first diode device for releasing a positive electrostatic surge voltage and a second diode device for releasing a negative electrostatic surge voltage, the first and second diode devices being coupled in parallel with each other.

2. The MOSFET device of claim 1, wherein the diode means includes first and second diode devices coupled in parallel with each other, and wherein one anode and cathode ends of the first and second diode devices are connected to each other while the other cathode and anode ends of the first and second diode devices are connected to each other.

3. The MOSFET device of claim 2, wherein the first diode device comprises a plurality of diodes connected in series to one another.

4. The MOSFET device of claim 1, wherein a channel width of the current mirror MOSFET is approximately one several thousandth to one several tens of thousandths that of the power MOSFET.

5. The MOSFET device of claim 3, wherein the first diode devices are provided in multi-stages.

* * * * *